(12) United States Patent
Lai et al.

(10) Patent No.: US 10,679,914 B2
(45) Date of Patent: Jun. 9, 2020

(54) ELECTRONIC PACKAGE AND METHOD FOR MANUFACTURING THE SAME

(71) Applicant: Siliconware Precision Industries Co., Ltd., Taichung (TW)

(72) Inventors: Chieh-Lung Lai, Taichung (TW); Cheng-Yi Chen, Taichung (TW); Chun-Hung Lu, Taichung (TW); Mao-Hua Yeh, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/635,446

(22) Filed: Jun. 28, 2017

(65) Prior Publication Data

US 2018/0254232 A1 Sep. 6, 2018

(30) Foreign Application Priority Data

Mar. 3, 2017 (TW) .............................. 106106981 A

(51) Int. Cl.
*H01L 23/31* (2006.01)
*H01L 23/00* (2006.01)
(Continued)

(52) U.S. Cl.
CPC .......... *H01L 23/3114* (2013.01); *H01L 21/78* (2013.01); *H01L 23/16* (2013.01); *H01L 23/3128* (2013.01); *H01L 23/3135* (2013.01); *H01L 23/562* (2013.01); *H01L 24/19* (2013.01); *H01L 24/20* (2013.01); *H01L 24/96* (2013.01); *H01L 24/97* (2013.01); *H01L 21/561* (2013.01); *H01L 21/568* (2013.01); *H01L 24/03* (2013.01); *H01L 24/05* (2013.01); *H01L 24/13* (2013.01); *H01L 2224/0231* (2013.01); *H01L 2224/0237* (2013.01); *H01L 2224/04105* (2013.01); *H01L 2224/12105* (2013.01);
(Continued)

(58) Field of Classification Search
CPC ..... H01L 21/561; H01L 21/568; H01L 21/78; H01L 23/3114; H01L 23/3135; H01L 23/562; H01L 24/96; H01L 24/03; H01L 24/05; H01L 24/13; H01L 2224/0231; H01L 2224/12105; H01L 2224/0237; H01L 2224/13024; H01L 2924/3511
See application file for complete search history.

(56) References Cited

U.S. PATENT DOCUMENTS

2015/0021754 A1* 1/2015 Lin ..................... H01L 23/5389
257/712
2017/0125375 A1* 5/2017 Chinnusamy ..... H01L 23/49541
(Continued)

*Primary Examiner* — Jay C Chang
(74) *Attorney, Agent, or Firm* — Mintz Levin Cohn Ferris Glovsky and Popeo, P.C.; Peter F. Corless; Steven M. Jensen

(57) ABSTRACT

The disclosure provides an electronic package and a method of manufacturing the same. The method is characterized by encapsulating an electronic component with a packaging layer and forming on an upper surface of the packaging layer a circuit structure that is electrically connected to the electronic component; and forming a stress-balancing layer on a portion of the lower surface of the packaging layer to balance the stress exerted on the upper and lower surfaces of the packaging layer, thereby reducing the overall package warpage and facilitating the manufacturing process.

7 Claims, 5 Drawing Sheets

(51) Int. Cl.
*H01L 23/16* (2006.01)
*H01L 21/78* (2006.01)
*H01L 21/56* (2006.01)

(52) U.S. Cl.
CPC *H01L 2224/13024* (2013.01); *H01L 2224/18* (2013.01); *H01L 2924/19041* (2013.01); *H01L 2924/19042* (2013.01); *H01L 2924/19043* (2013.01); *H01L 2924/19105* (2013.01); *H01L 2924/3511* (2013.01)

(56) References Cited

U.S. PATENT DOCUMENTS

2017/0154913 A1* 6/2017 Jun .................. H01L 27/1469
2017/0207205 A1* 7/2017 Kim ................. H01L 21/486
2017/0287871 A1* 10/2017 Lu ..................... H01L 23/24

* cited by examiner

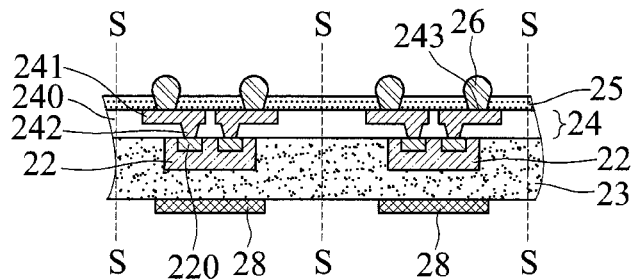
FIG.2D
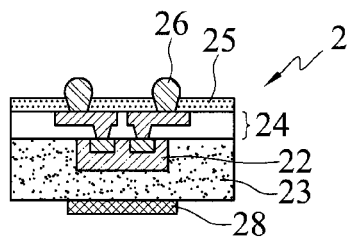
FIG.2E
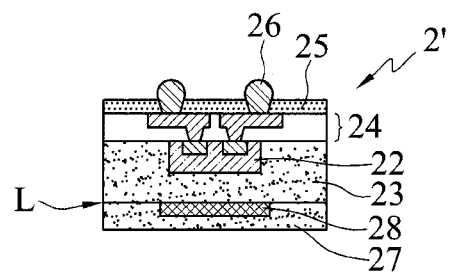
FIG.2E'
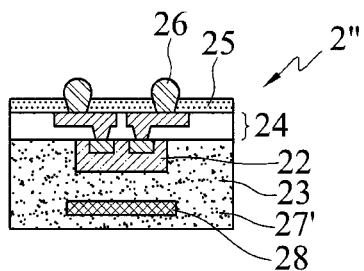
FIG.2E"

ELECTRONIC PACKAGE AND METHOD FOR MANUFACTURING THE SAME

CROSS-REFERENCE TO RELATED APPLICATION

This application claims under 35 U.S.C. § 119(a) the benefit of Taiwanese Patent Application No.106106981 filed Mar. 3, 2017, the entire contents of which are incorporated herein by reference.

BACKGROUND

Technical Field

The disclosure is related to packaging techniques, and, more particularly, to an electronic package and a method for manufacturing the same.

Description of Related Art

With recent development in electronic industry, electronic products have become more multifunctional and having higher performance. In order to satisfy the packaging demands for miniaturized semiconductor packages, chip scale packaging (CSP) technique has been developed, which is characterized in that a chip scale package only has a size equal to or slighter bigger than that of the chip.

Referring to FIGS. 1A to 1D, schematic cross-sectional views illustrating a conventional method for manufacturing a chip scale package 1 are shown.

As shown in FIG. 1A, a thermal release tape 11 is formed on a carrier 10.

Next, a plurality of semiconductor elements 12 are disposed on the thermal release tape 11. Each of the semiconductor elements 12 has an active surface 12a and a non-active surface 12b opposite to the active surface 12a. A plurality of electrode pads 120 are provided on each of the active surfaces 12a, and the semiconductor elements 12 are adhered to the thermal release tape 11 via the active surfaces 12a.

As shown in FIG. 1B, an encapsulant 13 is formed on the thermal release tape 11 to encapsulate the semiconductor elements 12.

As shown in FIG. 1C, the encapsulant 13 is cured by a baking process, and at the same time, the thermal release tape 11 will lose its adhesion due to heat, such that both the thermal release tape 11 and the carrier 10 can be removed simultaneously, exposing the active surfaces 12a of the semiconductor elements 12.

As shown in FIG. 1D, a redistribution layer (RDL) manufacturing process is performed, in which a circuit structure 14 including a dielectric layer 140 and a circuit layer 141 is formed on the encapsulant 13 and the active surfaces 12a of the semiconductor elements 12, such that the circuit structure 14 is electrically connected to the electrode pads 120 of the semiconductor elements 12.

Thereafter, an insulating protective layer 15 is formed on the circuit structure 14, with a portion of a surface of the circuit structure 14 exposed from the insulating protective layer 15 for being bonded with conductive elements 16 such as solder balls.

However, in the conventional method for manufacturing a chip scale package, since the encapsulant 13 and the dielectric layer 140 of the circuit structure 14 have quite different coefficients of thermal expansion (CTEs), CTE mismatch occurs, which creates various issues. For example, the CTE of the encapsulant 13 is about 30 ppm/° C., and the CTE of the dielectric layer 140 of the circuit structure 14 is about 60 ppm/° C., during a high temperature manufacturing process, the CTE mismatch will cause the semiconductor elements 12 to bend towards the dielectric layer 140 (the degree of bending is worsen by the number of dielectric layers 140), causing warpage in the chip scale package 1, such as the bending shown in FIG. 1D (i.e., the dotted profile of the encapsulant 13'), resulting in poor planarity of the chip scale package 1.

Moreover, a large degree of warpage will degrade the reliability of the electrical connections between the semiconductor elements 12 and the circuit layer 141 of the circuit structure 14, resulting in poor production yield and reliability. For example, there is a damage at a connection between the circuit structure 14 and an electrode pad 120 of a semiconductor element 12, and as the size of the carrier 10 gets larger, the position tolerance between the various semiconductor elements 12 increases. When the offset tolerance is too great, the circuit layer 141 of the circuit structure 14 cannot be connected with the electrode pads 120.

Furthermore, warpage may cause fragmentation of the semiconductor elements 12, lowering the production yield.

In addition, large degree of warpage may cause shut down in the manufacturing process of the chip scale package 1, or even affects the reliability of subsequent products. For example, the chip scale package 1 cannot be placed in the entry of a machine, causing problems associated with the management and manipulation of the machine and hinderance in the production output.

Therefore, there is an urgent need to find a solution that overcomes the aforementioned problems in the prior art.

SUMMARY

In view of the foregoing shortcomings in the prior art, the disclosure provides an electronic package, which may include: a packaging layer including a first surface and a second surface opposite to the first surface; at least one electronic component embedded in the packaging layer; a circuit structure formed on the first surface of the packaging layer and electrically connected with the electronic component; and a stress-balancing layer formed on a portion of the second surface of the packaging layer.

The disclosure further provides a method for manufacturing an electronic package, which may include: providing at least one electronic component on a carrier; forming a packaging layer on the carrier to encapsulate the electronic component, the packaging layer including a first surface and a second surface opposite to the first surface and being bonded to the carrier via the first surface; forming a stress-balancing layer on a portion of the second surface of the packaging layer; removing the carrier; and forming on the first surface of the packaging layer a circuit structure electrically connected with the electronic component.

In an embodiment, the electronic component includes an active surface and a non-active surface opposite to the active surface, and the active surface includes a plurality of electrode pads. In another embodiment, the non-active surface of the electronic component is exposed from the packaging layer.

In an embodiment, the stress-balancing layer occupies 1% to 99%, preferably 10% to 90%, of an area of the second surface of the packaging layer.

In an embodiment, the stress-balancing layer is formed on a plurality of regions on portions of the second surface of the packaging layer.

In an embodiment, the stress-balancing layer is further bonded to the electronic component.

In an embodiment, the electronic packaging further includes an encapsulating layer for encapsulating the stress-balancing layer. In another embodiment, an interface L exists between the encapsulating layer and the packaging layer. In yet another embodiment, the encapsulating layer is integrated with the packaging layer.

In an embodiment, the method further includes performing a singulation process.

In conclusion, the electronic package and the method for manufacturing the same according to the disclosure effectively balance the stress of the packaging layer by providing the stress-balancing layer on a portion of the second surface of the packaging layer, thereby reducing warpage of the overall structure of the electronic package and ensuring a smooth manufacturing process later on.

Moreover, since the warpage of the overall structure of the electronic package is greatly reduced, degradation in reliability of the electrical connections between the electronic component and the circuit layer of the circuit structure can be prevented, and fragmentation of the electronic component can also be prevented, thereby increasing product yield and reliability.

BRIEF DESCRIPTION OF THE DRAWINGS

FIGS. 2A to 2E are schematic cross-sectional views illustrating a method for manufacturing an electronic package in accordance with the disclosure;

FIG. 2A' is another embodiment corresponding to FIG. 2A; FIG. 2E' is another embodiment corresponding to FIG. 2E; and FIG. 2E" is another embodiment corresponding to FIG. 2E';

DETAILED DESCRIPTION OF THE EMBODIMENTS

Figure 1A:
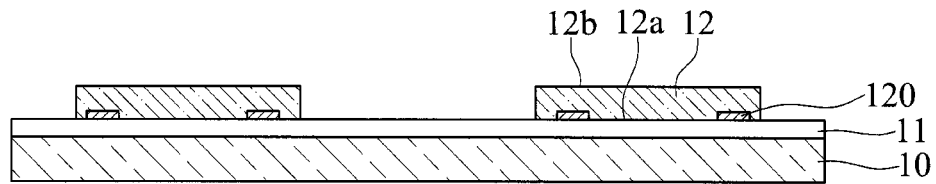
FIGS. 1A to 1D are schematic cross-sectional views illustrating a conventional method for manufacturing a chip scale package.
Figure 1B:
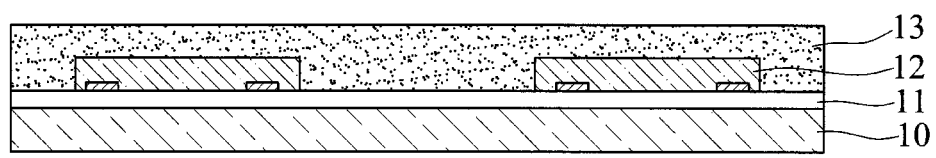
Figure 1C:
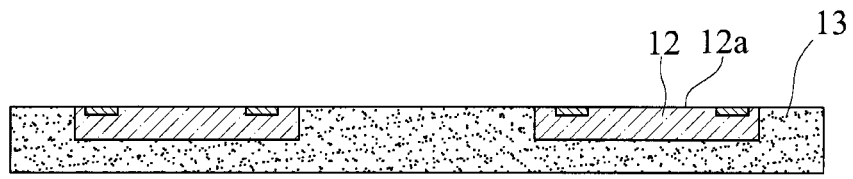
Figure 1D:
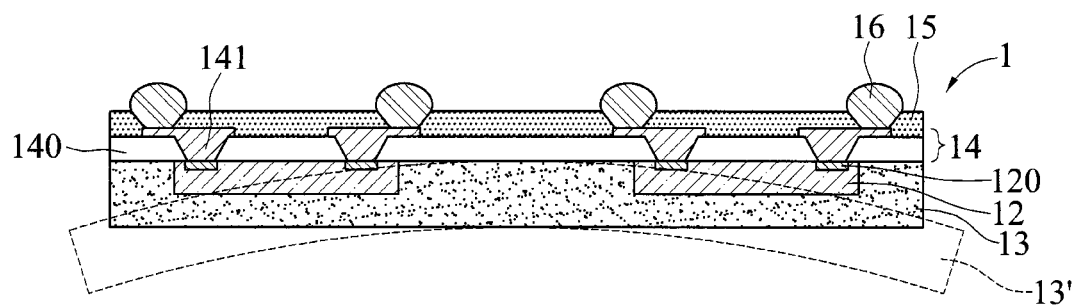

The disclosure is described by the following specific embodiments. Those with ordinary skills in the arts can readily understand other advantages and functions of the disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the disclosure, and therefore have no substantial technical meaning. Without affecting the effects created and objectives achieved by the disclosure, any modifications, changes or adjustments to the structures, ratio relationships or sizes, are to be construed as fall within the range covered by the technical contents disclosed herein. Meanwhile, terms, such as "above", "a", "one" and the like, are for illustrative purposes only, and are not meant to limit the range implementable by the disclosure. Any changes or adjustments made to their relative relationships, without modifying the substantial technical contents, are also to be construed as within the range implementable by the disclosure.

Referring to FIGS. 2A to 2E, schematic cross-sectional views illustrating a method for manufacturing an electronic package in accordance with the disclosure are shown.

Figure 2A:
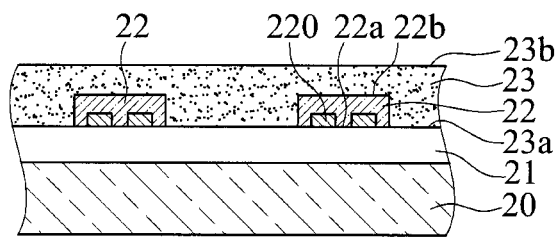
Figure 2A:
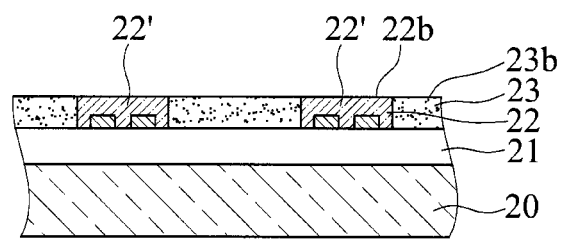

As shown in FIG. 2A, a plurality of electronic components 22 are disposed on a carrier 20, and a packaging layer 23 is further formed on the carrier 20 to encapsulate the electronic components 22.

In an embodiment, the carrier 20 can be, for example, a wafer, a silicon semiconductor substrate, a glass substrate, or the like. The carrier 20 is bonded to the electronic components 22 and the packaging layer 23 via an adhesive layer 21. In an embodiment, the adhesive layer 21 can be a thermal release tape.

Moreover, the electronic component 22 can be an active element, a passive element, or a combination of the above, wherein the active element can be, for example, a semiconductor chip, and the passive element can be, for example, a resistor, a capacitor or an inductor. In an embodiment, the electronic component 22 has an active surface 22a and a non-active surface 22b opposite to the active surface 22a. The active surface 22a includes a plurality of electrode pads 220. The electronic component 22 is bonded to the adhesive layer 21 via the active surface 22a.

In an embodiment, the packaging layer 23 includes a first surface 23a and a second surface 23b opposite to the first surface 23a, and is bonded to the adhesive layer 21 on the carrier via the first surface 23a. In an embodiment, the packaging layer 23 is formed on the carrier 20 by a lamination or molding process. In an embodiment, the packaging layer 23 can be made of polyimide (PI), a dry film, an epoxy resin, a molding compound, or the like.

As shown in FIG. 2A', the non-active surface 22b of the electronic component 22' can be exposed from the second surface 23b of the packaging layer 23 by polishing, for example.

Figure 2B:
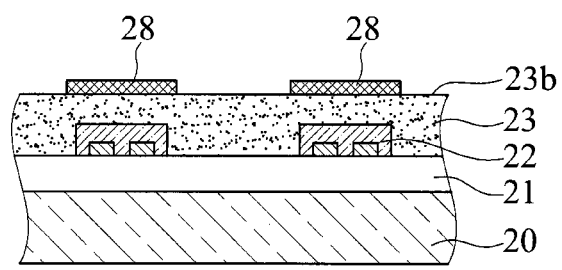

As shown in FIG. 2B, following the manufacturing process shown in FIG. 2A, a stress-balancing layer 28 is formed on a portion of the second surface 23b of the packaging layer 23.

In an embodiment, the coefficient of thermal expansion (CTE) of the stress-balancing layer 28 is not equal to the CTE of the packaging layer 23. In an embodiment, the stress-balancing layer 28 can be made of, but is not limited to, a metal material (aluminum, lead, copper, iron, gold, nickel, silver, or etc.) or an insulating material.

Furthermore, a stress-buffering material can be first formed on the entire second surface 23b of the packaging layer 23 by a patterning method, such as spin coating or film lamination. Then, a portion of the stress-buffering material is removed, with the remaining stress-buffering material forming the stress-balancing layer 28. Alternatively, a patterned stress-balancing layer 28 can be directly formed on a portion of the second surface 23b of the packaging layer 23 by film lamination. Alternatively, patterned plating or spin coating is performed directly on a portion of the second surface 23b of the packaging layer 23 to form the stress-balancing layer 28. There are numerous ways for forming the stress-balancing layer 28, and can be selected according to needs, and the disclosure are not limited to those described above.

Furthermore, the percentage of an area of the stress-balancing layer 28 occupying the second surface 23b of the packaging layer 23 is between 1% and 99%. Preferably, as shown in FIGS. 4A to 4F, the ratio (A/B) of the layout area A of the stress-balancing layer 28, 38 and the area B of the second surface 23b is between 10% and 90%.

In addition, the pattern of the stress-balancing layer 28, 38 may varies according to needs, such as in rectangles, circles, ring shapes or other shapes. The stress-balancing layer 28, 38 can be provided on a single region or a plurality of regions on a portion of the second surface 23b of the packaging layer 23 as long as the stress-balancing layer 28, 38 does not cover the entire second surface 23b.

Figure 2C:
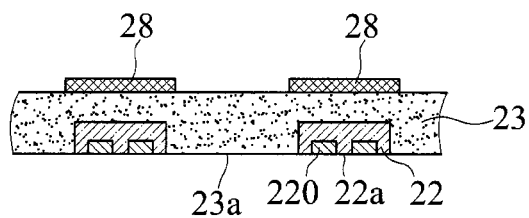

As shown in FIG. 2C, the carrier 20 and the adhesive layer 21 are removed to expose the active surfaces 22a of the electronic components 22 and the first surface 23a of the packaging layer 23.

In an embodiment, since the adhesive layer is a thermal release tape, after the packaging layer 23 is cured after a baking process, the adhesive layer 21 loses its adhesion, and can thus be removed along with the carrier 20.

As shown in FIG. 2D, a redistribution layer (RDL) manufacturing process is performed, in which a circuit structure 24 is formed on the first surface 23a of the packaging layer 23 and the active surfaces 22a of the electronic components 22, and the circuit structure 24 is electrically connected to the electrode pads 220 of the electronic components 22.

In an embodiment, the circuit structure 24 includes at least one dielectric layer 240 and at least one circuit layer 241 stacked on the dielectric layer 240. The dielectric layer 240 is formed on the first surface 23a of the packaging layer 23, and the circuit layer 241 is electrically connected to the electrode pads 220 of the electronic components 22 via a plurality of conductive blind vias 242.

In an embodiment, an insulating protective layer 25 can be further formed on the circuit structure 24, and a portion of a surface of the circuit layer 241 is exposed from the insulating protective layer 25 to be used as electrical contact pads 243, on which conductive elements 26, such as solder balls or metal bumps, are formed.

As shown in FIG. 2E, singulation process is performed along a cutting path S shown in FIG. 2D to obtain a plurality of electronic packages 2.

In an embodiment, as shown in FIG. 2E', after the carrier 20 and the adhesive layer 21 are removed (or after the circuit structure 24 is formed; after the singulation process; or after forming the stress-balancing layer 28), an encapsulating layer 27 for encapsulating the stress-balancing layer 28 can be formed. In an embodiment, the encapsulating layer 27 can be made of a material such as polyimide (PI), a dry film, an epoxy resin, a molding compound, or the like. In an embodiment, the encapsulating layer 27 and the packaging layer 23 can be made of the same or different materials, and an interface L exists between the encapsulating layer 27 and the packaging layer 23. Alternatively, as shown in FIG. 2E'', the encapsulating layer 27' is integrated with the packaging layer 23 by a manufacturing process (for example by hot melt then curing or other methods), and there is no interface between the encapsulating layer 27' and the packaging layer 23.

Figure 3A:
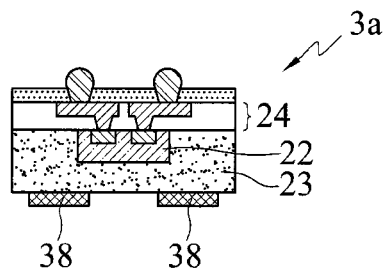
FIGS. 3A to 3D are schematic cross-sectional views illustrating other embodiments corresponding to FIG. 2E.
Figure 3B:
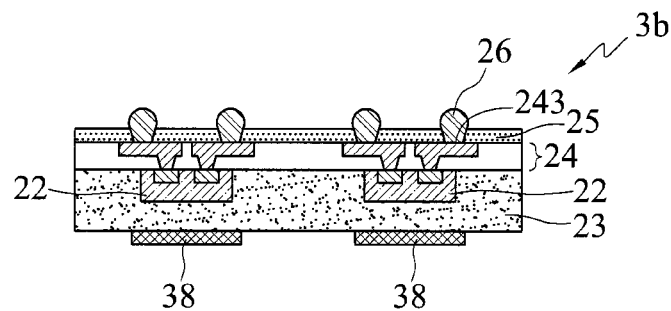
Figure 3C:
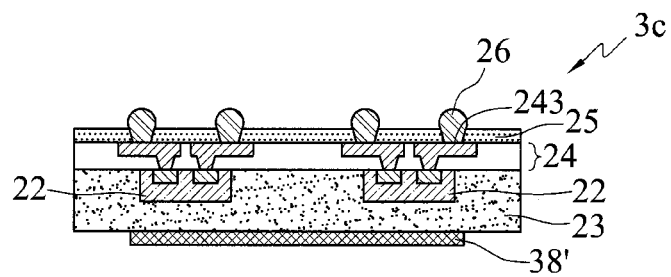

Furthermore, as shown in the electronic packages 2, 2' of FIGS. 2E and 2E', the stress-balancing layer 28 is formed on a single region of a portion of the second surface 23b of the packaging layer 23, such that a single electronic component 22 corresponds to the stress-balancing layer 28 in the single region. In another embodiment, for example, as shown in an electronic package 3a in FIG. 3A, a stress-balancing layer 28 is formed on a plurality of regions on of a portion of the second surface 23b of the packaging layer 23, such that a single electronic component 22 corresponds to the stress-balancing layer 28 in the plurality of regions. Alternatively, for example, as shown in an electronic package 3b in FIG. 3B, a plurality of electronic components 22 correspond to a stress-balancing layer 28 in a plurality of regions. Alternatively, for example, as shown in an electronic package 3c in FIG. 3C, a plurality of electronic components 22 correspond to a stress-balancing layer 28 in a single regions.

Figure 3D:
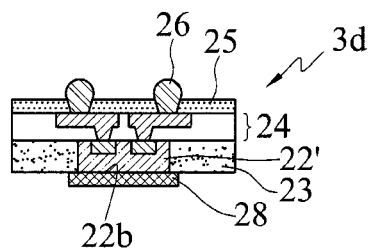
Figure 4A:
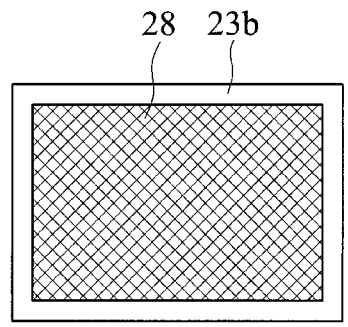
FIGS. 4A to 4F are schematic top views of different aspects corresponding to FIG. 2B.
Figure 4B:
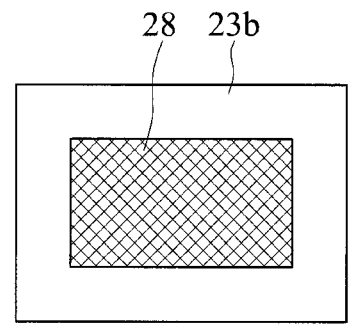
Figure 4C:
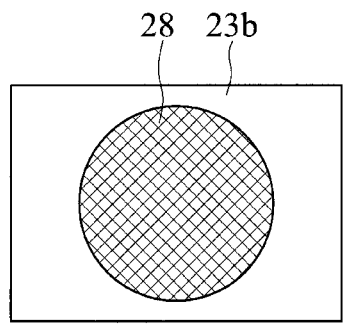
Figure 4D:
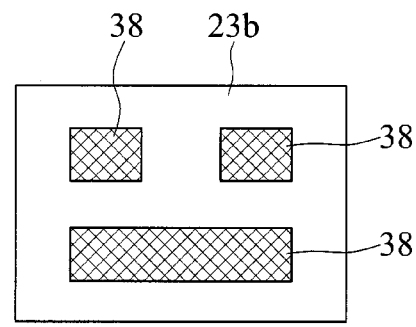
Figure 4E:
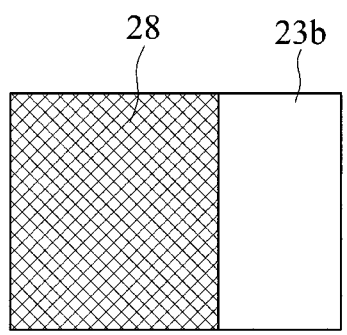
Figure 4F:
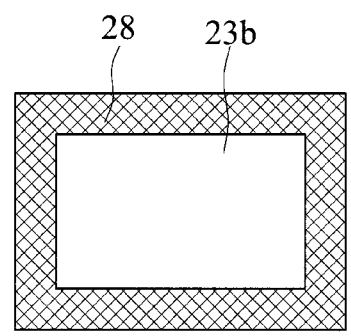

Further, if the subsequent process is carried out from the status shown in FIG. 2A', the stress-balancing layer 28 is bonded on the non-active surface 22b of the electronic component 22', as shown in FIG. 3D. It can be appreciated that the stress-balancing layers 38, 38' of the electronic packages 3a, 3b, 3c in FIGS. 3A to 3C can be in contact with the non-active surface 22b of the electronic component 22 as required.

In an embodiment, the stress-balancing layer 28, 38, 38' is formed on a portion of the second surface 23b of the packaging layer 23, the locations of the stress-balancing layer 28, 38, 38' can be flexibly adjusted (to be provided on areas where stress concentrates), and materials with different CTEs can be used to balance the stress experienced by the first surface 23a and the stress experienced by the second surface 23b of the packaging layer 23. Thus, compared to the prior art, the warpage of the overall structure of the electronic package 2, 2', 2'', 3a, 3b, 3c, 3d manufactured by the method according to the disclosure can be greatly reduced, ensuring a smooth subsequent process later on.

Moreover, the electronic package 2, 2', 2'', 3a, 3b, 3c, 3d according to the disclosure allows the packaging layer 23 to maintain stress balance and in turn less warpage by adjusting the thickness, the layout area, the pattern, or the CTE of the stress-balancing layer 28, 38, 38'. For example, the conditions (such as the selection of the material with regard to the magnitude of the CTE) of the stress-balancing layer 28, 38, 38' are chosen depending on the material and the number of layers of the dielectric layer 240.

Furthermore, since the warpage of the overall structure of the electronic package 2, 2', 2'', 3a, 3b, 3c, 3d is greatly reduced, degradation in reliability of the electrical connections between the electronic component 22, 22' and the circuit layer 241 of the circuit structure 24 can be prevented, and in turn low yield or poor product reliability is eliminated. Therefore, as the size of the carrier 20 gets greater, the location tolerance between the various electronic components 22, 22' will not increase accordingly, and electrical connections can be successfully made between the conductive blind vias 242 and the electrode pads 220, thereby increasing yield and product reliability.

In addition, since the warpage of the overall structure of the electronic package 2, 2', 3a, 3b, 3c, 3d is greatly reduced, fragmentation of the electronic component 22, 22' can be prevented, thereby effectively increasing production yield.

The disclosure also provides an electronic package 2, 2', 2'', 3a, 3b, 3c, 3d, which includes: a packaging layer 23, at least one electronic component 22, 22', a circuit structure 24 and a stress-balancing layer 28, 38, 38'.

The packaging layer 23 includes a first surface 23a and a second surface 23b opposite to the first surface 23a.

The electronic component 22, 22' is embedded in the packaging layer 23.

The circuit structure 24 is formed on the first surface 23a of the packaging layer 23 and electrically connected with the electronic component 22, 22'.

The stress-balancing layer 28, 38, 38' is formed on a portion of the second surface 23b of the packaging layer 23.

In an embodiment, the electronic component 22, 22' includes an active surface 22a and a non-active surface 22b opposite to the active surface 22a, and the active surface 22a includes a plurality of electrode pads 220. Furthermore, the non-active surface 22b of the electronic component 22' is exposed from the packaging layer 23.

In an embodiment, the stress-balancing layer 28, 38, 38' occupies 1% to 99%, preferably 10% to 90%, of the area of the second surface of the packaging layer.

In an embodiment, the stress-balancing layer 38 is formed on a plurality of regions on a portion of the second surface 23b of the packaging layer 23.

In an embodiment, the stress-balancing layer 28 is further bonded to the electronic component 22'.

In an embodiment, the electronic packaging 2', 2" further includes an encapsulating layer 27, 27' for encapsulating the stress-balancing layer 28. In an embodiment, an interface L exists between the encapsulating layer 27, 27' and the packaging layer 23. In another embodiment, the encapsulating layer 27, 27' is integrated with the packaging layer 23.

In conclusion, the electronic package and the method for manufacturing the same according to the disclosure effectively balances the stress of the packaging layer by providing the stress-balancing layer on a portion of the second surface of the packaging layer, thereby reducing warpage of the overall structure of the electronic package and ensuring a smooth manufacturing process later on.

Moreover, since the warpage of the overall structure of the electronic package is greatly reduced, degradation in reliability of the electrical connections between the electronic component and the circuit layer of the circuit structure can be prevented, and fragmentation of the electronic component can also be prevented, thereby increasing product yield and reliability.

The above embodiments are only used to illustrate the principles of the disclosure, and should not be construed as to limit the disclosure in any way. The above embodiments can be modified by those with ordinary skill in the art without departing from the scope of the disclosure as defined in the following appended claims.

What is claimed is:

1. An electronic package, comprising:
   a packaging layer including a first surface and a second surface opposite to the first surface;
   at least one electronic component embedded in the packaging layer;
   a circuit structure formed on the first surface of the packaging layer and electrically connected with the electronic component;
   an encapsulating layer formed on the second surface of the packaging layer; and
   a stress-balancing layer embedded in the encapsulating layer and formed on a portion of the second surface of the packaging layer,
   wherein the encapsulating layer is fully integrated with the packaging layer such that there is no interface between the encapsulating layer and the packaging layer, the encapsulating layer encapsulates the stress-balancing layer, and the stress-balancing layer is free from being electrically connected with the circuit structure.

2. The electronic package of claim 1, wherein the electronic component includes an active surface and a non-active surface opposite to the active surface, and wherein the active surface includes a plurality of electrode pads electrically connected to the circuit structure.

3. The electronic package of claim 2, wherein the non-active surface is exposed from the packaging layer.

4. The electronic package of claim 1, wherein the stress-balancing layer occupies 1% to 99% of an area of the second surface of the packaging layer.

5. The electronic package of claim 4, wherein the stress-balancing layer occupies 10% to 90% of the area of the second surface of the packaging layer.

6. The electronic package of claim 1, wherein the stress-balancing layer is formed on a plurality of regions on portions of the second surface of the packaging layer.

7. The electronic package of claim 1, wherein the stress-balancing layer is bonded to the electronic component.

\* \* \* \* \*